United States Patent [19]

Sasaki et al.

[11] Patent Number: 5,998,016
[45] Date of Patent: Dec. 7, 1999

[54] SPIN VALVE EFFECT MAGNETORESISTIVE SENSOR AND MAGNETIC HEAD WITH THE SENSOR

[75] Inventors: Tetsuro Sasaki; Noriyuki Ito, both of Nagano, Japan

[73] Assignee: TDK Corporation, Tokyo, Japan

[21] Appl. No.: 09/006,177

[22] Filed: Jan. 13, 1998

[30] Foreign Application Priority Data

Jan. 16, 1997 [JP] Japan .................................. 9-017754

[51] Int. Cl.$^6$ ......................................................... G11B 5/39
[52] U.S. Cl. ........................ 428/336; 428/692; 428/900; 360/113; 338/32 R
[58] Field of Search ............................. 360/113; 428/692, 428/332, 336, 900; 338/32 R

[56] References Cited

U.S. PATENT DOCUMENTS

| | | |
|---|---|---|
| 5,422,571 | 6/1995 | Gurney et al. . |
| 5,639,547 | 6/1997 | Mitsuoka et al. .................... 428/332 |
| 5,896,252 | 4/1999 | Kanai ..................................... 360/113 |
| 5,898,549 | 4/1999 | Gill ........................................ 360/113 |

OTHER PUBLICATIONS

"Design, Fabrication & Testing of Spin–Valve Read Heads for High Density Recording", Tsang et al, *IEEE Transactions*, vol. 30, No. 6, Nov. 1994, pp. 3801–3806.

*Primary Examiner*—Stevan A. Resan
*Attorney, Agent, or Firm*—Nikaido, Marmelstein, Murray & Oram LLP

[57] ABSTRACT

A spin valve effect MR sensor includes a spin valve effect multi-layered structure. This structure has a first thin film layer of ferromagnetic material with one and the other surfaces, a second thin film layer of ferromagnetic material with one and the other surfaces, a thin film spacer layer of nonmagnetic conductive material deposited between the one surfaces of the first and second ferromagnetic material layers, a thin film layer of anti-ferromagnetic material deposited on the other surface of the second ferromagnetic material layer, for pinning the second ferromagnetic material layer, a thin film layer of anti-diffusion material deposited on the other surface of the first ferromagnetic material layer, and a thin film current bypass layer of nonmagnetic conductive material deposited on the thin film anti-diffusion material layer.

12 Claims, 5 Drawing Sheets

SAMPLE 1: Ta 50Å/NiFe 70Å/Cu 25Å/Co 25Å/FeMn 100Å/Ta 50Å
SAMPLE 2: Ta 50Å/Ta 20Å/Cu 20Å/NiFe 50Å/Cu 25Å/Co 25Å/FeMn 100Å/Ta 50Å
SAMPLE 3: Ta 50Å/Cu 30Å/Ta 10Å/NiFe 50Å/Cu 25Å/Co 25Å/FeMn 100Å/Ta 50Å

SPIN VALVE EFFECT MAGNETORESISTIVE SENSOR AND MAGNETIC HEAD WITH THE SENSOR

FIELD OF THE INVENTION

The present invention relates to a magnetoresistive (MR) sensor utilizing the spin valve effect and a magnetic head with the MR sensor.

DESCRIPTION OF THE RELATED ART

A spin valve effect element is known as one of elements providing the giant MR effect. This spin valve effect element has a sandwiched structure with two ferromagnetic material thin film layers magnetically separated by a nonmagnetic metallic spacer thin film layer. An anti-ferromagnetic material thin film layer is laminated in contact with one of the two uncoupled ferromagnetic material layers so as to produce an exchange biasing magnetic field at their boundary and to apply it to this ferromagnetic material layer. Therefore, this one ferromagnetic material layer (pinned layer) receives the exchange biasing magnetic field, whereas the other ferromagnetic material layer (free layer) receives no exchange biasing magnetic field so that magnetization switching is introduced by different magnetic field between the two ferromagnetic material layers. The magnetization directions of the two ferromagnetic material layers therefore change between in parallel and in antiparallel with each other so that the electrical resistivity of this spin valve effect element greatly varies to obtain the large MR effects.

It has been reported for example in Ching Tsang et al., "Design, fabrication & testing of spin-valve read heads for high density recording", IEEE transaction magazine, volume 30 No. 6, pp3801–3806, November 1994, that amplitude asymmetry of negative and positive signal responses of the MR head with the above-mentioned spin valve effect element will increase when the sense current supplied to the MR head varies.

When the amplitude asymmetry of negative and positive responses of the signal reproduced by the MR head increases, error in amplitude of the reproduced signal will increase. Therefore, in case that an amplitude detection system is used for processing this reproduced signal, the signal error rate will become worse. In case that a peak detection system is used instead of the amplitude detection system, influence of noise will increase due to smaller differential value at a saturated side of the peak than the other side causing also the error rate of the reproduced signal to become worse.

SUMMARY OF THE INVENTION

It is therefore an object of the present invention to provide a spin valve effect MR sensor and a magnetic head with the MR sensor, whereby variation of amplitude asymmetry of negative and positive responses of a signal reproduced by the MR sensor based upon variation of the sense current can be prevented.

It is another object of the present invention to provide a spin valve effect MR sensor and a magnetic head with the MR sensor, whereby a characteristics of a free layer in the MR sensor can be prevented from deterioration.

Inventors of this application had studied to prevent the error rate of the reproduced signal from becoming worse due to variation of amplitude asymmetry of negative and positive responses of a signal reproduced by the MR sensor, and had found that the asymmetry variation occurs because the center of the sense current flow is positioned at a nonmagnetic metallic spacer layer which is sandwiched by the free layer and the pinned layer. Namely, since the sense current flows through the MR sensor with keeping its center at the nonmagnetic metallic spacer layer, intensity of the magnetic field produced by the sense current and applied to the free layer varies with the variation of the sense current causing the asymmetry of the reproduced signal to greatly change.

The inventors had therefore considered that if the center of the sense current flow is positioned in the free layer, the variation of the asymmetry of the reproduced signal with the variation of the sense current may be prevented, and thus made the spin valve effect structure with a current bypass layer of low resistance metallic material such as Cu, Au or Ag formed on a surface of the free layer, which surface is the opposite surface against the nonmagnetic metallic spacer layer. By making the current bypass layer at this position, the center of the sense current flow positions in the free layer or near the free layer causing the asymmetry variation due to the sense current magnetic field to reduce.

However, the current bypass layer made of nonmagnetic metallic material such as Cu, Au or Ag directly in contact with the free layer would invite diffusion in the free layer during a heating process causing a coercive force of the free layer to increase and also its sensitivity to deteriorate.

U.S. Pat. No. 5,422,571 discloses a spin valve effect structure with a nonmagnetic electrically conductive material back layer adjacent to the free layer for transmitting there through conduction electrons which have spins parallel to the direction of magnetization in the free layer so as to obtain a larger conductance change. In the specification of this U.S. Pat. No. 5,422,579, a multi-layered structure of Ta(50 Angstroms)/Cu/NiFe(15 Angstroms)/Cu(23 Angstroms)/NiFe(50 Angstroms)/FeMn(110 Angstroms)/Ta (50 Angstroms) or Ta(50 Angstroms)/NiFe(20 Angstroms)/FeMn(80 Angstroms)/NiFe(50 Angstroms)/Cu(23 Angstroms)/NiFe(20 Angstroms)/Ta(30 Angstroms) formed on a substrate is disclosed. However, there is no teaching in the U.S. Pat. No. 5,422,579 with respect to control of position of sense current flow for improving variation of the reproduced signal asymmetry.

According to the present invention, a spin valve effect MR sensor and a magnetic head including a transducer element for reading magnetic information, constituted by the spin valve effect MR sensor are provided. The sensor includes a spin valve effect multi-layered structure having a first thin film layer of ferromagnetic material with one and the other surfaces, a second thin film layer of ferromagnetic material with one and the other surfaces, a thin film spacer layer of nonmagnetic conductive material deposited between the one surfaces of the first and second ferromagnetic material layers, a thin film layer of anti-ferromagnetic material deposited on the other surface of the second ferromagnetic material layer, for pinning the second ferromagnetic material layer, a thin film layer of anti-diffusion material deposited on the other surface of the first ferromagnetic material layer, and a thin film current bypass layer of nonmagnetic conductive material deposited on the thin film anti-diffusion material layer.

The spin valve effect multi-layered structure has the first and second ferromagnetic layers (pinned layer and free layer) magnetically separated by the nonmagnetic spacer layer and the antiferromagnetic layer deposited on the pinned layer. When the external magnetic field is not applied, the magnetization direction of the free layer is substantially perpendicular to the magnetization direction of the pinned layer. The magnetization direction of the pinned layer is constrained and held (pinned) by the exchange coupling provided by means of the anti-ferromagnetic layer which physically contacts with this pinned layer. Contrary to this, the magnetization direction of the free layer spins freely depending upon the applied external magnetic field. When the sense current is supplied from the current source to the MR sensor with such spin valve effect multi-layered structure, the voltage drop which is proportional to the electrical resistivity variation of the MR sensor caused by the magnetization spin in the free layer as a function of the applied external magnetic field is appeared across the output terminals of the MR sensor. The extent of the electrical resistivity variation of the MR sensor is represented by a cosine function of the change in the angle between the magnetization directions of the free and pinned layers, which corresponds to the magnetic field of data bits recorded on the magnetic medium above which this MR sensor runes.

Particularly, according to the present invention, the structure additionally has the current bypass layer deposited on the back of the free layer and the anti-diffusion layer deposited between the free layer and the current bypass layer. Therefore, variation of amplitude asymmetry of negative and positive responses of the signal reproduced by the MR sensor based upon variation of sense current can be prevented, and thus the error rate of the reproduced signal can be prevented from increasing. Also, since the anti-diffusion layer is deposited between the free layer and the current bypass layer, the characteristics of the free layer in the MR sensor never deteriorate during the heating process.

It is preferred that the thin film current bypass layer is made of material selected from the group consisting of Cu, Ag, Au, a compound containing Cu, a compound containing Ag, and a compound containing Au.

It is also preferred that the thin film current bypass layer has a thickness of 8 to 70 Angstroms.

It is preferred that the anti-diffusion material layer is made or material selected from the group consisting of Ta, Ti, Cr, W, Si, Ru, Rh, Pd, Pt, Zr, Hf, Nb, Mo, V, and a nonmagnetic compound containing one of Ta, Ti, Cr, W, Si, Ru, Rh, Pd, Pt, Zr, Hf, Nb, Mo and V.

Preferably, the anti-diffusion material layer may be made of an oxide. In this case, the oxide may be $Al_2O_3$ or $SiO_2$.

Preferably, the anti-diffusion material layer is made of a nitride. In this case, the nitride may be SiN or AlN.

Preferably, the anti-diffusion material layer is made of a carbide. In this case, the carbide may be SiC or TiC.

It is also preferred that the anti-diffusion material layer has a thickness equal to or more than 3 Angstroms.

Further objects and advantages of the present invention will be apparent from the following description of the preferred embodiments of the invention as illustrated in the accompanying drawings.

DESCRIPTION OF THE PREFERRED EMBODIMENTS

Figure 1:
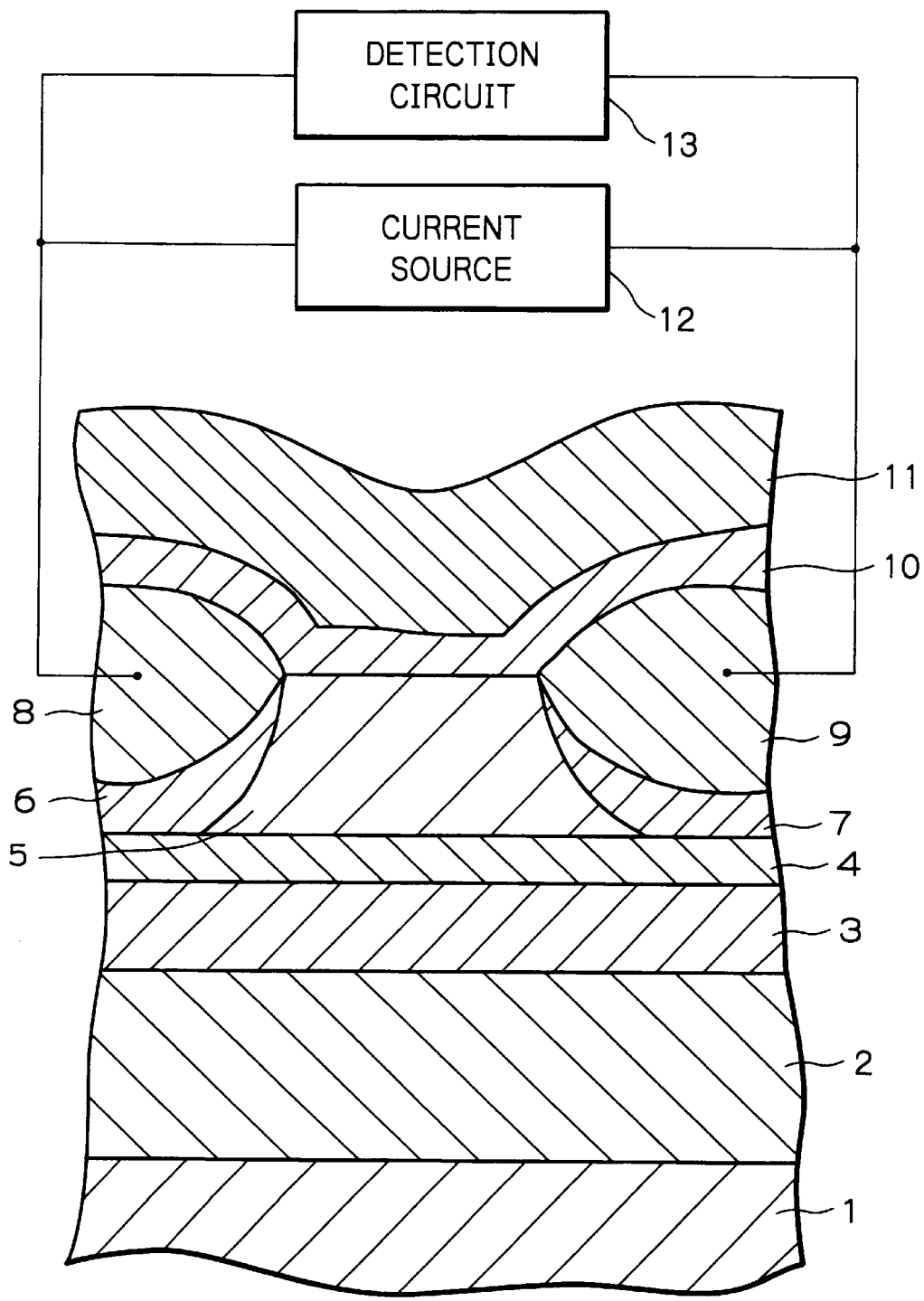
FIG. 1 is a sectional view schematically illustrating a spin valve effect MR sensor in a preferred embodiment according to the present invention.

In FIG. 1 which schematically illustrates a spin valve effect MR sensor in a preferred embodiment according to the present invention, reference numeral 1 denotes a substrate made of for example $Al_2O_3$-TiC. On the substrate 1, an under film 2 made of for example $Al_2O_3$ is deposited. On the under film 2, a lower shield layer 3 and a lower insulating material layer 4 made of for example $Al_2O_3$ are sequentially deposited. On the lower insulating material layer 4, a spin valve effect multi-layered structure 5 which constitutes a principal portion of the MR head is formed. This spin valve effect multi-layered structure 5 has side faces in a curved or straight tapered configuration, and is formed within the central active region substantially corresponding to a track width of the MR head.

Thin film layers of hard ferromagnetic material 6 and 7 are deposited on the lower insulating material layer 4 in contact with the curved or straight tapered side faces of the spin valve effect multi-layered structure 5. The layers or hard ferromagnetic material 6 and 7 have high coercivety and high squareness and are adopted to produce a longitudinal bias for maintaining the free layer of the spin valve effect multi-layered structure 5 in a single domain state. On the thin film layers of hard ferromagnetic material 6 and 7, electrical leads of conductive material 8 and 9 for transmitting the sense current to the MR sensor and for picking up its detected output are deposited in contact with the hard ferromagnetic material layers 6 and 7 along the tapered side faces of the spin valve effect multi-layered structure 5.

On the electrical leads 8 and 9 and also on the spin valve effect multi-layered structure 5, an upper insulating material layer 10 made of for example $Al_2O_3$ and an upper shield layer 11 are sequentially deposited. A current source 12 for supplying the sense current to the MR sensor and also a detection circuit 13 For detecting electrical resistance variation of the MR sensor by means of voltage variation are electrically connected to the electrical leads 8 and 9.

Figure 2:
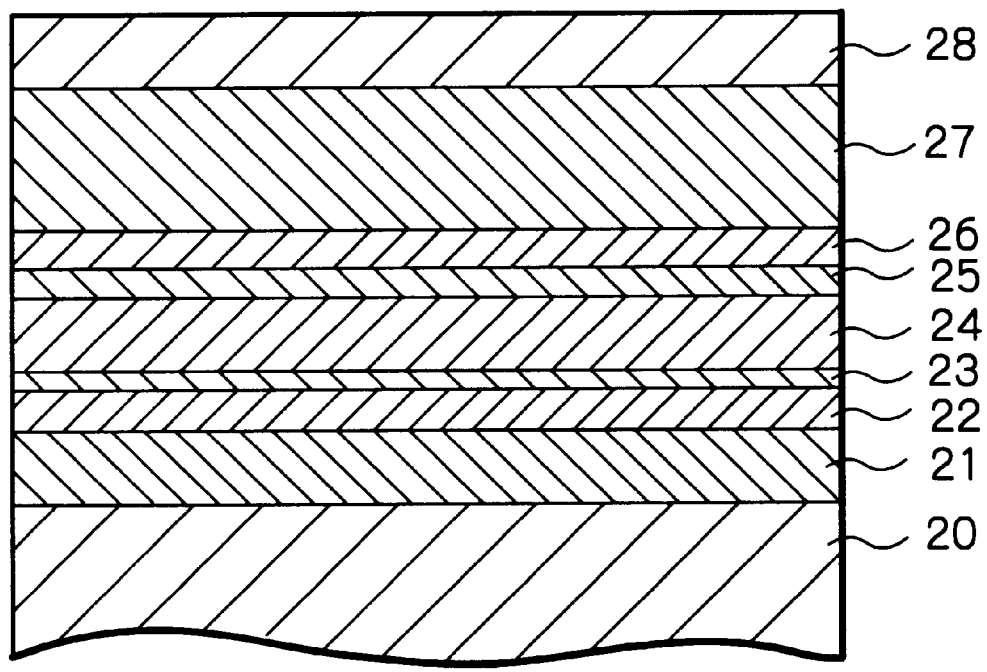
FIG. 2 is a sectional view illustrating an example of a multi-layered structure of the spin valve effect element shown in FIG. 1.

In FIG. 2 which illustrates an example of a multi-layered structure of the spin valve effect element 5 shown in FIG. 1, reference numeral 20 indicates a substrate body consisting of the aforementioned substrate 1, the under layer 2, the lower shield layer 3 and the lower insulating material layer 4, and 21 indicates a buffer layer made of for example Ta with thickness of about 50 Angstroms and deposited on the substrate body 20. On the buffer layer 21, a current bypass layer 22 made of nonmagnetic conductive material such as for example Cu with a thickness of about 30 Angstroms is deposited. This current bypass layer 22 may be made of another nonmagnetic conductive material such as Ag, Au, a compound containing Cu (for example Cu alloy), a compound containing Ag (for example Ag alloy) or a compound containing Au (for example Au alloy), with a thickness of about 8–70 Angstroms.

An anti-diffusion layer 23 made of for example Ta with a thickness of about 10 Angstroms is deposited on the current bypass layer 22. This anti-diffusion layer 23 may be made of another nonmagnetic material such as Ti, Cr, W, Si, Ru, Rh, Pd, Pt, Zr, Hf, Nb, Mo, V, or a nonmagnetic compound containing any one of Ta, Ti, Cr, W, Si, Ru, Rh, Pd, Pt, Zr, Hf, Nb, Mo and V (for example a nonmagnetic alloy containing any one of Ta, Ti, Cr, W, Si, Ru, Rh, Pd, Pt, Zr, Hf, Nb, Mo and V). The anti-diffusion layer 23 can be made of an oxide such as $Al_2O_3$ or $SiO_2$, a nitride such as SiN or AlN, or a carbide such as SiC or TiC. This anti-diffusion layer 23 has a thickness of 3 Angstroms or more, preferably about 3–20 Angstroms.

On the anti-diffusion layer 23, a first thin film layer of ferromagnetic material (free layer) 24 such as NiFe with a thickness of about 50 Angstroms, a thin film layer of nonmagnetic conductive material spacer layer 25 such as Cu with a thickness of about 25 Angstroms, a second thin film layer of ferromagnetic material (pinned layer) 26 such as Cu with a thickness of about 25 Angstroms and a thin film layer of anti-ferromagnetic material (exchange biasing magnetic material) 27 such as FeMn with a thickness of about 100 Angstroms are sequentially deposited in this order. The thin film layer 27 provides the anti-ferromagnetic exchange coupling to pin the direction of magnetization of the second thin film layer 26.

On the anti-ferromagnetic material thin film layer 27, a capping or protection layer 28 made of for example Ta with a thickness of about 50 Angstroms.

In other words, the spin valve effect multi-layered structure shown in FIG. 2 has a layer configuration of Ta(50 Angstroms)/Cu(30 Angstroms)/Ta(10 Angstroms)/NiFe(50 Angstroms)/Cu(25 Angstroms)/Co(25 Angstroms)/FeMn (100 Angstroms)/Ta(50 Angstroms) formed on the substrate body 20.

Since the current bypass layer 22 is formed near the free layer 24, the sense current will flow through the spin valve effect structure with keeping its center in or near the free layer 24 so as to reduce the variation of the asymmetry based upon the sense current magnetic field. As a result, the variation of amplitude asymmetry of negative and positive responses of the signal reproduced by the MR sensor based upon the variation of the sense current can be prevented, and also the error rate of the reproduced signal can be prevented from becoming worse.

In addition, since the anti-diffusion layer 23 is inserted between the current bypass layer 22 and the free layer 24 so that the current bypass layer 22 does not directly contact with the free layer 24, no diffusion will occur during a heating process and thus characteristics of the free layer 24, such as its coercive force and its sensitivity, can be prevented from deterioration.

Figure 3:
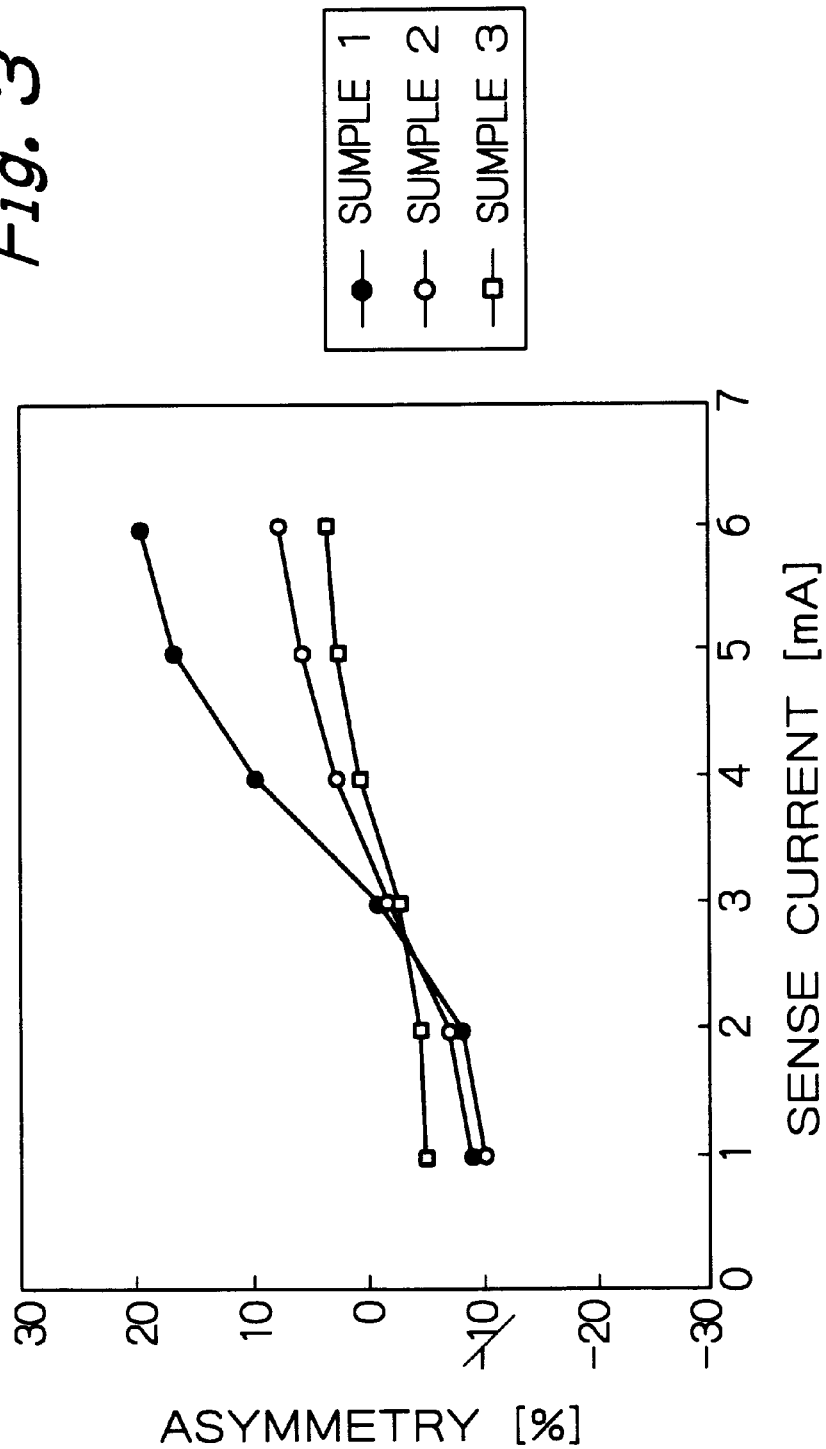
FIG. 3 is a graph illustrating asymmetry characteristics of reproduced signal from the MR sensor with respect to the sense current.

FIG. 3 illustrates asymmetry characteristics of reproduced signals with respect to the sense current according to the MR sensor of this embodiment and to the conventional MR sensor. The asymmetry of this figure indicates a ratio of the difference between the absolute positive peak value and the absolute negative peak value of the reproduced signal with respect to the sum of both the absolute positive peak and negative peak values.

According to the conventional spin valve effect structure with no current bypass layer, shown as sample 1 in this figure, the asymmetry varies from −10% to +20% in response to the variation of the sense current Is from 1 mA to 6 mA. Whereas according to the embodiment shown as sample 3 which has the current bypass layer 22 and the anti-diffusion layer 23 and also to the similar layer configuration shown as sample 2, the asymmetry variation in response to the variation of the sense current is very small.

Figure 4:
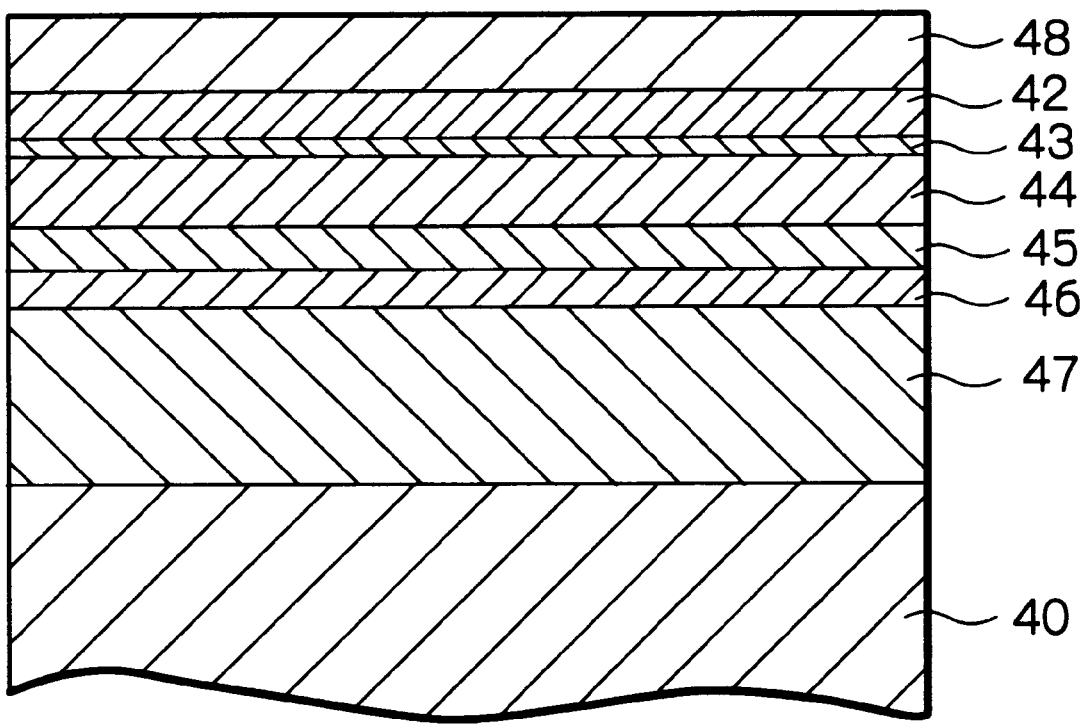
FIG. 4 is a sectional view illustrating another example of a multi-layered structure of the spin valve effect element shown in FIG. 1.

FIG. 4 schematically illustrates a spin valve effect MR sensor in a modified embodiment according to the present invention. In this embodiment, the spin valve effect multi-layered structure is formed by depositing the layers in an order opposite to the above-mentioned order.

In the figure, reference numeral 40 indicates a substrate body consisting of the aforementioned substrate 1, the under layer 2, the lower shield layer 3 and the lower insulating material layer 4, arid 47 indicates a thin film layer of anti-ferromagnetic material (exchange biasing magnetic material) such as for example NiMn with a thickness of about 250 Angstroms deposited on the substrate body 40. The thin film layer 47 provides the anti-ferromagnetic exchange coupling to pin the direction of magnetization of a second thin film layer 46 to be deposited thereon.

On the anti-ferromagnetic material thin film layer 47, the second thin film layer of ferromagnetic material (pinned layer) 46 such as Co with a thickness of about 25 Angstroms, a thin film layer of nonmagnetic conductive material spacer layer 45 such as Cu with a thickness of about 25 Angstroms and a first thin film layer of ferromagnetic material (free layer) 44 such as NiFe with a thickness of about 50 Angstroms are sequentially deposited in this order.

An anti-diffusion layer 43 made of for example Ta with a thickness of about 10 Angstroms is deposited on the free layer 44. This anti-diffusion layer 43 may be made of another nonmagnetic material such as Ti, Cr, W, Si, Ru, Rh, Pd, Pt, Zr, Hf, Nb, Mo, V, or a nonmagnetic compound containing any one or Ta, Ti, Cr, W, Si, Ru, Rh, Pd, Pt, Zr, Hf, Nb, Mo and V (for example a nonmagnetic alloy containing any one of Ta, Ti, Cr, W, Si, Ru, Rh, Pd, Pt, Zr, Hf, Nb, Mo and V). The anti-diffusion layer 43 can be made of an oxide such as $Al_2O_3$ or $SiO_2$, a nitride such as SiN or AlN, or a carbide such as SiC or TiC. This anti-difrusion layer 43 has a thickness of 3 Angstroms or more, preferably about 3–20 Angstroms.

On the anti-diffusion layer 43, a current bypass layer 42 made of nonmagnetic conductive material such as for example Cu with a thickness of about 30 Angstroms is deposited. This current bypass layer 42 may be made of another nonmagnetic conductive material such as Ag, Au, a compound containing Cu (for example Cu alloy), a compound containing Ag (for example Ag alloy) or a compound containing Au (for example Au alloy), with a thickness of about 8–70 Angstroms.

On the current bypass layer 42, a capping or protection layer 48 made of for example Ta with a thickness of about 50 Angstroms.

In other words, the spin valve effect multi-layered structure shown in FIG. 4 has a layer configuration of NiMn(250 Angstroms)/Co(25 Angstroms)/Angstroms)/Cu(25 Angstroms)/NiFe(50 Angstroms)/Ta(10 Angstroms)/Cu(30 Angstroms)/Ta(5 Angstroms) formed on the substrate body 40.

Since the current bypass layer 42 is formed near the free layer 44, the sense current will flow through the spin valve effect structure with keeping its center in or near the free layer 44 so as to reduce the variation of the asymmetry based upon the sense current magnetic field. As a result, the variation of amplitude asymmetry of negative and positive responses of the signal reproduced by the MR sensor based upon the variation of the sense current can be prevented, and also the error rate of the reproduced signal can be prevented from becoming worse.

In addition, since the anti-diffusion layer 43 is inserted between the current bypass layer 42 and the free layer 44 so that the current bypass layer 42 does not directly contact with the free layer 44, no diffusion will occur during a heating process and thus characteristics of the free layer 44, such as its coercive and its sensitivity, can be prevented from deterioration.

Table 1 and 2 show asymmetry variation of samples having various layer configurations when the sense current changes from 1 mA to 6 mA.

sample S-3 uses Au with the thickness of 40 Angstroms as the current bypass layer and Cr with the thickness of 5 Angstroms as the anti-diffusion layer. The sample S-4 uses

TABLE 1

| SAMPLES | LAYER CONFIGURATION (THICKNESS IS INDICATED BY ANGSTROM) | | | | | | | | ASYMMETRY VARIATION WHEN SENSE CURRENT CHANGES 1–6 mA |
|---|---|---|---|---|---|---|---|---|---|
| S-1 | Ta / 50 | NiFe / 70 | Cu / 25 | Co / 25 | FeMn / 100 | Ta 50 | | | 30% |
| S-2 | Ta / 50 | Cu / 10 | Ta / 3 | NiFe / 50 | Cu / 25 | Co / 25 | FeMn / 100 | Ta 50 | 19% |
| S-3 | Ta / 50 | Au / 40 | Gr / 5 | NiFe / 40 | Co / 5 | Cu / 30 | Co / 20 | FeMn / 100 | Ta 50 | 5% |
| S-4 | Ta / 50 | Ag / 50 | Ti / 15 | NiFe / 20 | CoFe / 50 | Cu / 25 | CoFe / 20 | IrMn / 100 | Ta 50 | 3% |
| S-5 | NiMn / 250 | Co / 25 | Cu / 25 | Co / 5 | NiFe / 40 | SiN / 3 | Cu / 20 | Ta 50 | 17% |
| S-6 | Ta / 50 | NiFe / 100 | FeMn / 100 | Co / 20 | Cu / 25 | NiFe / 70 | W / 20 | Cu / 10 | Ta 50 | 20% |
| S-7 | Ta / 50 | Au / 50 | Al₂O₃ / 10 | NiFe / 70 | Cu / 35 | CoFe / 25 | PdMn / 100 | Ta 50 | 5% |
| S-8 | Ta / 50 | Cu / 10 | Si / 10 | NiFe / 50 | Cu / 25 | Co / 25 | FeMn / 100 | Ta 50 | 19% |

TABLE 2

| SAMPLES | LAYER CONFIGURATION (THICKNESS IS INDICATED BY ANGSTROM) | | | | | | | ASYMMETRY VARIATION WHEN SENSE CURRENT CHANGES 1–6 mA |
|---|---|---|---|---|---|---|---|---|
| S-9 | Ta / 50 | AuSi / 50 | Ta / 3 | NiFe / 50 | Cu / 25 | Co / 25 | FeMn / 100 | Ta 50 | 3% |
| S-10 | Ta / 50 | CuMg / 50 | TaSi / 10 | NiFe / 50 | Cu / 25 | Cn / 25 | FeMn / 100 | Ta 50 | 4% |
| S-11 | Ta / 50 | CuAu / 50 | AlSi / 15 | NiFe / 50 | Cu / 25 | Co / 25 | FeMn / 100 | Ta 50 | 3% |
| S-12 | Ta / 50 | AgAl / 50 | CrPt / 5 | NiFe / 50 | Cu / 25 | Co / 25 | FeMn / 100 | Ta 50 | 2% |
| S-13 | Ta / 50 | AuAg / 50 | MoSi / 20 | NiFe / 50 | Cu / 25 | Co / 25 | FeMn / 100 | Ta 50 | 4% |
| S-14 | Ta / 50 | AuPt / 50 | NbTi / 20 | NiFe / 50 | Cu / 25 | Co / 25 | FeMn / 100 | Ta 50 | 3% |
| S-15 | Ta / 50 | Cu / 50 | Hf / 10 | NiFe / 50 | Cu / 25 | Co / 25 | FeMn / 100 | Ta 50 | 3% |
| S-16 | Ta / 50 | Cu / 50 | RhTa / 15 | NiFe / 50 | Cu / 25 | Co / 25 | FeMn / 100 | Ta 50 | 3% |
| S-17 | Ta / 50 | Cu / 50 | RuTa / 15 | NiFe / 50 | Cu / 25 | Co / 25 | FeMn / 100 | Ta 50 | 2% |
| S-18 | Ta / 50 | Cu / 50 | TiV / 20 | NiFe / 50 | Cu / 25 | Co / 25 | FeMn / 100 | Ta 50 | 3% |
| S-19 | Ta / 50 | Cu / 50 | TiZr / 15 | NiFe / 50 | Cu / 25 | Co / 25 | FeMn / 100 | Ta 50 | 4% |
| S-20 | Ta / 50 | Cu / 50 | MoPt / 10 | NiFe / 50 | Cu / 25 | Co / 25 | FeMn / 100 | Ta 50 | 3% |
| S-21 | Ta / 50 | Cu / 50 | SiO₂ / 10 | NiFe / 50 | Cu / 25 | Co / 25 | FeMn / 100 | Ta 50 | 3% |
| S-22 | Ta / 50 | Cu / 50 | AlN / 10 | NiFe / 50 | Cu / 25 | Co / 25 | FeMn / 100 | Ta 50 | 3% |
| S-23 | Ta / 50 | Cu / 50 | TiC / 10 | NiFe / 50 | Cu / 25 | Co / 25 | FeMn / 100 | Ta 50 | 4% |
| S-24 | Ta / 50 | Cu / 50 | SiC / 10 | NiFe / 50 | Cu / 25 | Co / 25 | FeMn / 100 | Ta 50 | 3% |

The sample S-1 has the conventional layer configuration with no current bypass layer and therefore provides a large asymmetry variation of 30%. The samples S-2 to S-24 are spin valve effect multi-layered structures according to the present invention. The sample S-2 uses Cu with the thickness of 10 Angstroms as the current bypass layer and Ta with the thickness of 3 Angstroms as the anti-diffusion layer. The Ag with the thickness of 50 Angstroms as the current bypass layer and Ti with the thickness of 15 Angstroms as the anti-diffusion layer. The sample S-5 has inverse order for layer deposition and uses Cu with the thickness of 20 Angstroms as the current bypass layer and SiN with the thickness of 3 Angstroms as the anti-diffusion layer. The sample S-6 also has inverse order for layer deposition and uses Cu with the thickness of 10 Angstroms as the current bypass layer and W with the thickness of 20 Angstroms as the anti-diffusion layer. The sample S-7 uses Au with the thickness of 50 Angstroms as the current bypass layer and $Al_2O_3$ with the thickness of 10 Angstroms as the anti-diffusion layer. The sample S-8 uses Cu with the thickness of 10 Angstroms as the current bypass layer and Si with the thickness of 10 Angstroms as the anti-diffusion layer. The sample S-9 uses AuSi with the thickness of 50 Angstroms as the current bypass layer and Ta with the thickness of 3 Angstroms as the anti-diffusion layer. The sample S-10 uses CuMg with the thickness of 50 Angstroms as the current bypass layer and TaSi with the thickness of 10 Angstroms as the anti-diffusion layer. The sample S-11 uses CuAu with the thickness of 50 Angstroms as the current bypass layer and AlSi with the thickness of 15 Angstroms as the anti-diffusion layer. The sample S-12 uses AgAl with the thickness of 50 Angstroms as the current bypass layer and CrPt with the thickness of 5 Angstroms as the anti-diffusion layer. The sample S-13 uses AuAg with the thickness of 50 Angstroms as the current bypass layer and MoSi with the thickness of 20 Angstroms as the anti-diffusion layer. The sample S-14 uses AuPt with the thickness of 50 Angstroms as the current bypass layer and NbTi with the thickness of 20 Angstroms as the anti-diffusion layer. The sample S-15 uses Cu with the thickness of 50 Angstroms as the current bypass layer and Hf with the thickness of 10 Angstroms as the anti-diffusion layer. The sample S-16 uses Cu with the thickness of 50 Angstroms as the current bypass layer and RhTa with the thickness of 15 Angstroms as the anti-diffusion layer. The sample S-17 uses Cu with the thickness of 50 Angstroms as the current bypass layer and RuTa with the thickness of 15 Angstroms as the anti-diffusion layer. The sample S-18 uses Cu with the thickness of 50 Angstroms as the current bypass layer and TiV with the thickness of 20 Angstroms as the anti-diffusion layer. The sample S-19 uses Cu with the thickness of 50 Angstroms as the current bypass layer and TiZr with the thickness of 15 Angstroms as the anti-diffusion layer. The sample S-20 uses Cu with the thickness of 50 Angstroms as the current bypass layer and MoPt with the thickness of 10 Angstroms as the anti-diffusion layer. The sample S-21 uses Cu with the thickness of 50 Angstroms as the current bypass layer and $SiO_2$ with the thickness of 10 Angstroms as the anti-diffusion layer. The sample S-22 uses Cu with the thickness of 50 Angstroms as the current bypass layer and AlN with the thickness of 10 Angstroms as the anti-diffusion layer. The sample S-23 uses Cu with the thickness of 50 Angstroms as the current bypass layer and TiC with the thickness of 10 Angstroms as the anti-diffusion layer. The sample S-24 uses Cu with the thickness of 50 Angstroms as the current bypass layer and SiC with the thickness of 10 Angstroms as the anti-diffusion layer.

Each of the samples S-2 to S-24 using the current bypass layer and the anti-diffusion layer provides very small asymmetry variation with respect to the sense current change.

Figure 5:
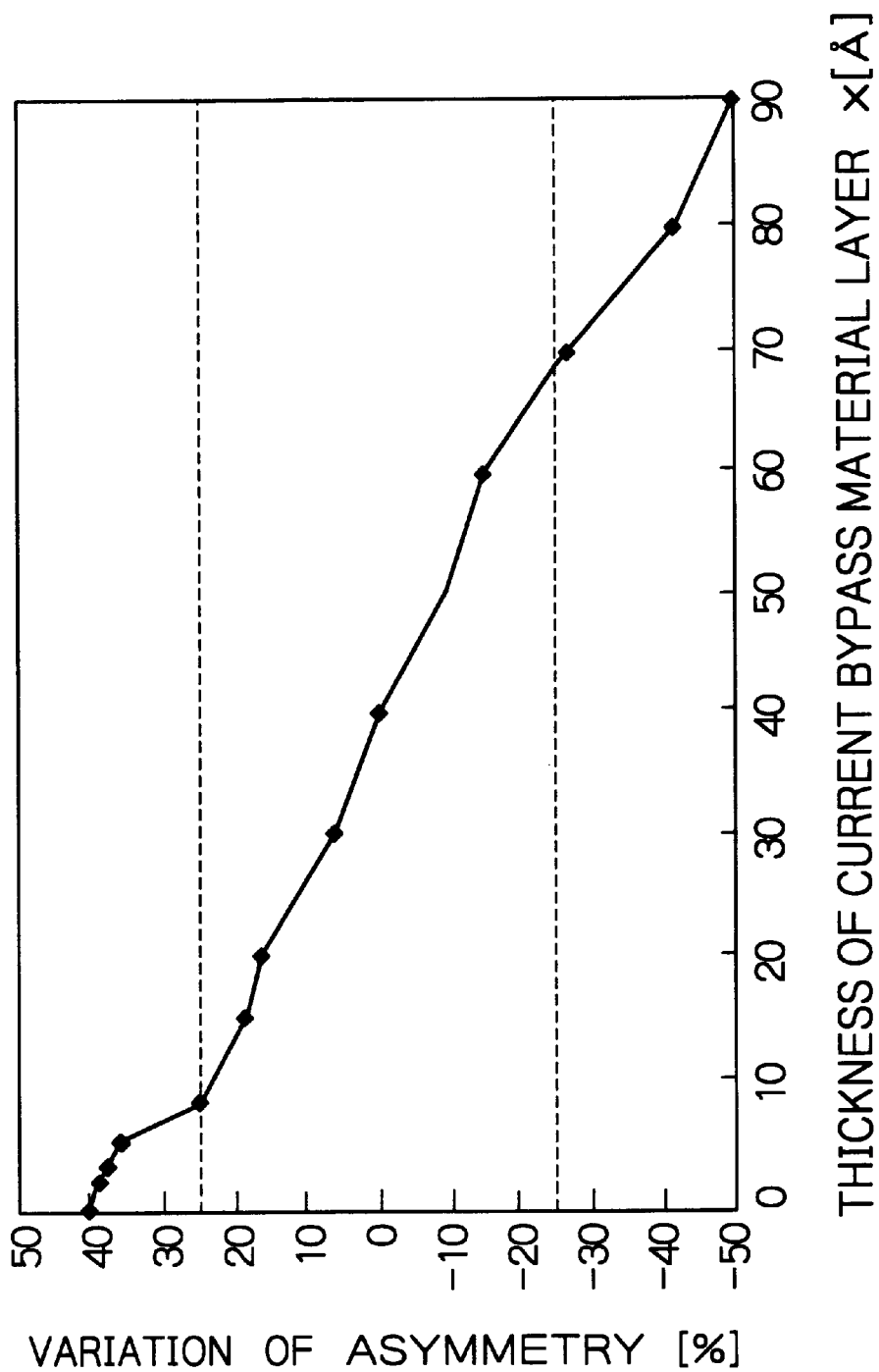
FIG. 5 is a graph illustrating asymmetry characteristics of reproduced signal from the MR sensor with respect to the thickness of the current bypass layer.

The thickness of the current bypass layer is preferably 8–70 Angstroms. FIG. 5 illustrates asymmetry variation of reproduced signal from a spin valve effect multi-layered structure when the sense current changes from 1 mA to 6 mA (difference between an asymmetry at the sense current of 1 mA and an asymmetry at the sense current of 6 mA), with respect to the thickness x of the current bypass layer made of Cu. The layer configuration of this multi-layered structure is Ta(50 Angstroms)/Cu(x Angstroms)/Ta(10 Angstroms)/NiFe(50 Angstroms)/Cu(25 Angstroms)/Co(25 Angstroms)/FeMn(100 Angstroms)/Ta(50 Angstroms).

As will be understood from the figure, the asymmetry variation is 40% when the thickness of the current bypass layer x is zero (x=0), namely there is no current bypass layer whereas the asymmetry variation is very small, namely within ±25%, when the thickness of the current bypass layer x is 8 to 70 Angstroms (x=8 to 70). If the asymmetry variation is out of the range ±25%, the error rate becomes very large and therefore it is impossible to use as the MR sensor for a magnetic read head.

Many widely different embodiments of the present invention may be constructed without departing from the spirit and scope of the present invention. It should be understood that the present invention is not limited to the specific embodiments described in the specification, except as defined in the appended claims.

What is claim is:

1. A spin valve effect magnetoresistive sensor including a spin valve effect multi-layered structure, said structure comprising:

a first thin film layer of ferromagnetic material with one and the other surfaces;

a second thin film layer of ferromagnetic material with one and the other surfaces;

a thin film spacer layer of nonmagnetic conductive material deposited between said one surfaces of said first and second ferromagnetic material layers;

a thin film layer of anti-ferromagnetic material deposited on the other surface of said second ferromagnetic material layer, for pinning the second ferromagnetic material layer;

a thin film layer or anti-diffusion material deposited on the other surface of said first ferromagnetic material layer; and a thin film current bypass layer of nonmagnetic conductive material deposited on said thin film anti-diffusion material layer.

2. The sensor as claimed in claim 1, wherein said thin film current bypass layer is made of material selected from the group consisting of Cu, Ag, Au, a compound containing Cu, a compound containing Ag, and a compound containing Au.

3. The sensor as claimed in claim 1, wherein said thin film current bypass layer has a thickness of 8 to 70 Angstroms.

4. The sensor as claimed in claim 1, wherein said anti-diffusion material layer is made of material selected from the group consisting of Ta, Ti, Cr, W, Si, Ru, Rh, Pd, Pt, Zr, Hf, Nb, Mo, V, and a nonmagnetic compound containing one of Ta, Ti, Cr, W, Si, Ru, Rh, Pd, Pt, Zr, Hf, Nb, Mo and V.

5. The sensor as claimed in claim 1, wherein said anti-diffusion material layer is made of an oxide.

6. The sensor as claimed in claim 5, wherein said anti-diffusion material layer is made of $Al_2O_3$ or $SiO_2$.

7. The sensor as claimed in claim 1, wherein said anti-diffusion material layer is made of a nitride.

8. The sensor as claimed in claim 7, wherein said anti-diffusion material layer is made of SiN or AlN.

9. The sensor as claimed in claim 1, wherein said anti-diffusion material layer is made of a carbide.

10. The sensor as claimed in claim 9, wherein said anti-fusion material layer is made of SiC or TiC.

11. The sensor as claimed in claim 1, wherein said anti-diffusion material layer has a thickness equal to or more than Angstroms.

12. A magnetic head including a transducer element for reading magnetic information, said transducer element being constituted by the spin valve effect magnetoresistive sensor claimed in claim 1.

* * * * *